(12) United States Patent
Ahn et al.

(10) Patent No.: US 7,462,912 B2
(45) Date of Patent: Dec. 9, 2008

(54) SEMICONDUCTOR MEMORY DEVICE HAVING POWER DECOUPLING CAPACITOR

(75) Inventors: Soon-Hong Ahn, Gyeonggi-do (KR); Jung-Hwa Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 105 days.

(21) Appl. No.: 11/361,580

(22) Filed: Feb. 24, 2006

(65) Prior Publication Data

US 2006/0289932 A1 Dec. 28, 2006

(30) Foreign Application Priority Data

Jun. 23, 2005 (KR) .................. 10-2005-0054365

(51) Int. Cl.
*H01L 29/76* (2006.01)
*H01L 29/00* (2006.01)

(52) U.S. Cl. ............... 257/334; 257/534; 257/E29.309; 257/E21.679; 257/E21.423; 257/E21.21; 257/E21.18

(58) Field of Classification Search .................. 237/334
See application file for complete search history.

(56) References Cited

U.S. PATENT DOCUMENTS

| | | | |
|---|---|---|---|
| 6,433,381 B2 | 8/2002 | Mizutani et al. | |
| 6,803,641 B2 | 10/2004 | Papa Rao et al. | |
| 7,166,882 B2 * | 1/2007 | Nakamura et al. | 257/306 |
| 2006/0113633 A1 * | 6/2006 | Park et al. | 257/534 |

FOREIGN PATENT DOCUMENTS

| | | |
|---|---|---|
| KR | 1998-035297 | 8/1998 |
| KR | 2000-0045346 | 7/2000 |
| KR | 2000-0066946 | 11/2000 |

OTHER PUBLICATIONS

English language abstract of Korean Publication No. 1998-035297.
English language abstract of Korean Publication No. 2000-0045346.
English language abstract of Japanese Publication No. 2000-0066946.

* cited by examiner

*Primary Examiner*—Sue A. Purvis
*Assistant Examiner*—Tony Tran
(74) *Attorney, Agent, or Firm*—Marger Johnson & McCollom, P.C.

(57) ABSTRACT

Provided is a semiconductor memory device using a layout scheme where a bottom conductive layer in a peripheral circuit region, which is simultaneously formed with a self-align contact, is connected to one electrode of a power decoupling capacitor. Predetermined capacitors selected among a plurality of capacitors are connected to each other in parallel by using a conductive layer that is simultaneously formed with the self-align contact in a cell array region. Herein, the conductive layer and the self-align contact may be made of the same material. It is possible to embody the decoupling capacitor of a single stage cell type by connecting the conductive layer to a top interconnection layer. In addition, other embodiments implement the decoupling capacitor in a two-stage cell type by connecting a plurality of decoupling capacitors in series by means of the conductive layer in the peripheral circuit region.

20 Claims, 12 Drawing Sheets

SEMICONDUCTOR MEMORY DEVICE HAVING POWER DECOUPLING CAPACITOR

CROSS-REFERENCE TO RELATED PATENT APPLICATION

This application claims the benefit of Korean Patent Application No. 10-2005-0054365, filed on Jun. 23, 2005, in the Korean Intellectual Property Office, the disclosure of which is incorporated herein in its entirety by reference.

BACKGROUND OF THE INVENTION

1. Field of the Invention

The present invention relates to a semiconductor memory device; and, more particularly, to a semiconductor memory device having a power decoupling capacitor formed in a peripheral circuit region.

2. Description of the Related Art

As semiconductor memory devices, such as dynamic random access memory (DRAM), become more highly integrated, it is necessary for them to meet the demand for high operational speed as well as large storage capacity. In addition, the required number of operation circuits increases in proportion to the level of integration of the semiconductor memory devices, which causes severe fluctuation noise in the power supply voltage ($V_{DD}$) and ground voltage ($V_{SS}$) during read/write operations. To solve this problem, a power decoupling capacitor is formed in the semiconductor memory device to filter noise existing in an operating voltage, such as the power supply voltage ($V_{DD}$) and the ground voltage ($V_{SS}$).

Many attempts have been made to form a decoupling capacitor of high capacitance in a peripheral circuit region by using the same structure of a capacitor formed in a memory cell array region. Specifically, one proposed technology calls for simultaneously forming the cell capacitor and the decoupling capacitor by using a capacitor over bit line (COB) type storage node in which the capacitor is formed over a bit line in the memory cell array.

Figure 1:
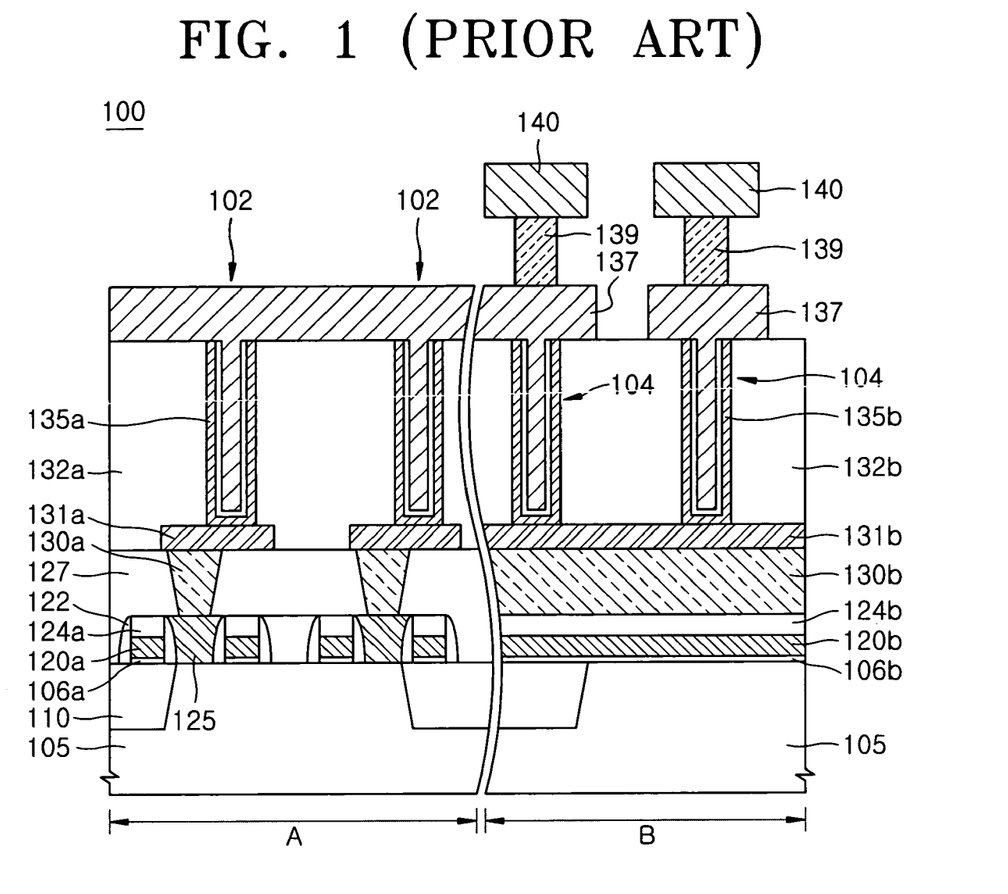
FIG. 1 is a sectional view of a conventional semiconductor memory device.

FIG. 1 is a sectional view of a conventional semiconductor memory device.

Referring to FIG. 1, the conventional semiconductor memory device 100 includes a cell array region A, in which a cell capacitor 102 is formed, and a peripheral circuit region B, in which a decoupling capacitor 104 is formed. A storage electrode 135a of the cell capacitor 102 and a storage electrode 135b of the decoupling capacitor 104 are formed on buffer layers 131a and 131b, respectively. The buffer layers 131a and 131b electrically connect the storage electrode 135a and 135b to buried contacts 130a and 130b, respectively. In the cell array region A, the storage electrode 135a is electrically connected to the buried contact 130a through the buffer layer 131a, while having a predetermined align margin.

The buried contact 130a is formed in the cell array region A after an interlayer dielectric layer 127 is patterned into a predetermined configuration so as to form a contact hole (not shown). The storage node electrodes 135a and 135b are formed on mold oxide layers 132a and 132b in the cell array region A and the peripheral circuit region B, respectively. In addition, the buried contact 130a of the cell array region A is electrically connected to an active region of a semiconductor substrate 105 through a gate electrode 120a and a self-align contact pad 125 which is self-aligned by space walls 122. More specifically, the buried contact 130a is electrically connected to source/drain regions (not shown) formed in the active region of the substrate 105, which are defined by an isolation region 110. A top surface of the gate electrode 120a is covered with a capping layer 124a, and a gate insulating layer 106a is formed below the gate electrode 120a.

In the peripheral circuit region B, the buried contact 130b is formed directly on the capping layer 124b. Furthermore, a gate insulating layer 106b, a gate electrode 120b, the capping layer 124b and the buried contact 130b are stacked over the semiconductor substrate in sequence. Meanwhile, the buffer layer 131b, which is formed on the buried contact 130b, is used as a connection line for connecting a plurality of decoupling capacitors 104 in series. Moreover, a plate electrode 137 of the decoupling capacitor 104 is connected to a metal interconnection 140 through a metal contact 139.

Figure 2:
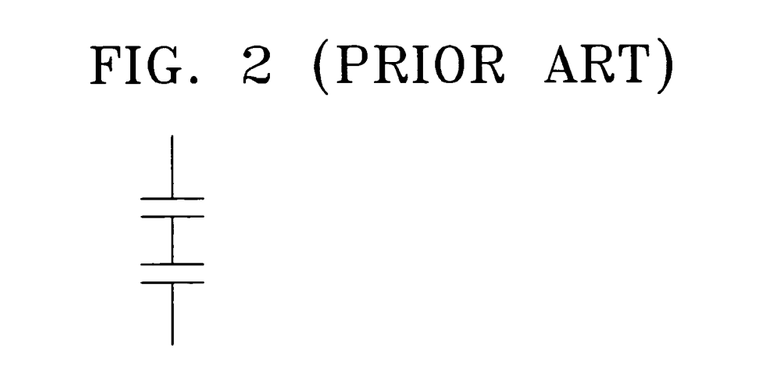
FIG. 2 is an equivalent circuit diagram of decoupling capacitors formed in the peripheral circuit region of the conventional semiconductor memory device illustrated in FIG. 1.

FIG. 2 is an equivalent circuit diagram of the decoupling capacitors formed in the peripheral circuit region of the conventional semiconductor memory device illustrated in FIG. 1. However, in more recent developments, the buffer layer 131a has been omitted in the cell array region A. Accordingly, a predetermined scheme in which the buffer layer 131b is omitted and the decoupling capacitor 104 is directly connected to the buried contact 130b in the peripheral circuit region B has been proposed. This scheme is illustrated in FIG. 3, where FIG. 3 is a sectional view of another conventional semiconductor memory device.

Figure 3:
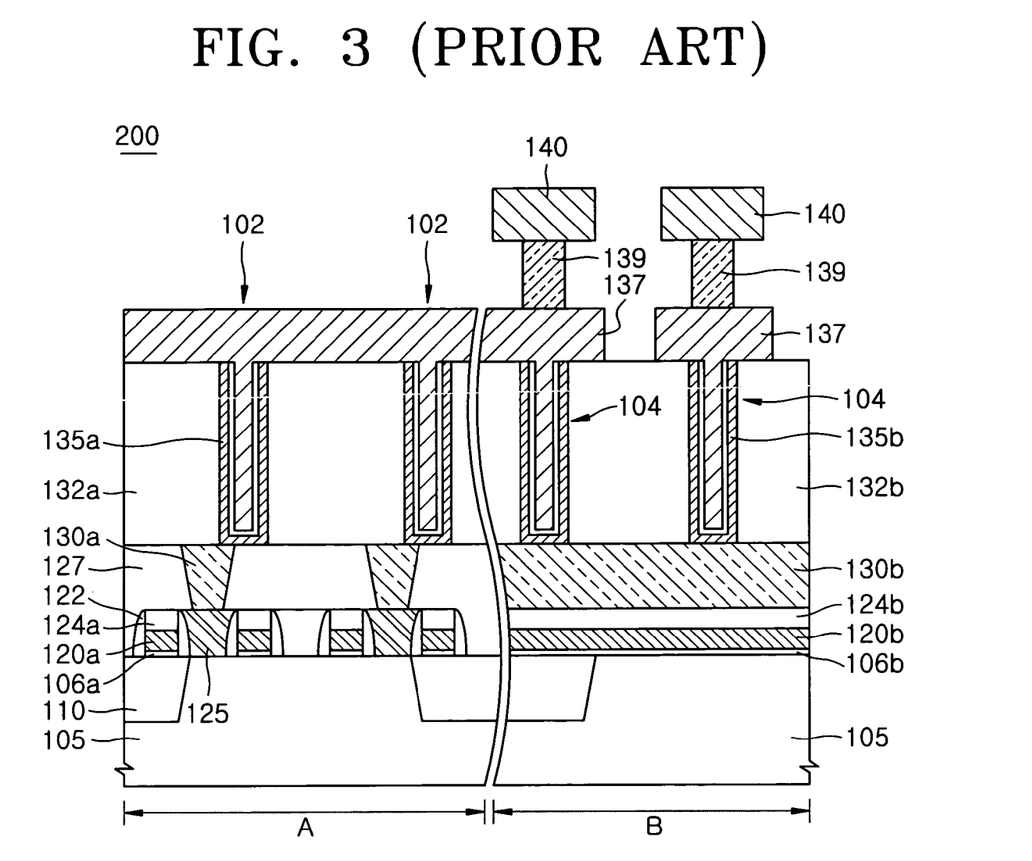
FIG. 3 is a sectional view of another conventional semiconductor memory device.

In comparison with the conventional memory device 100 of FIG. 1, most of elements and constitution of a conventional memory device 200 illustrated in FIG. 3 are similar except that the decoupling capacitor 104 is directly connected to the buried contact 130b because the buffer layer 131b is omitted in the peripheral circuit region B. Because like reference numerals in FIG. 3 denote like elements in FIG. 1, further descriptions of the elements of conventional memory device 200 will be omitted.

In FIG. 3, the buried contact 130b is used as a connection line for serially connecting the plurality of decoupling capacitors 104 in the peripheral circuit region B of the conventional memory device 200.

However, by using the buried contact 130b as the connection line for connecting the decoupling capacitors 104 in series, there may be a decrease in the capacitance of the decoupling capacitor 104 due to high resistance of the buried contact 130b.

While it still may be possible to implement the decoupling capacitor of a two stage cell type in which two capacitors are connected to each other in series as illustrated in FIG. 2, there is still a drawback in that it is difficult to implement the decoupling capacitor of a single stage cell type in which only one capacitor is represented in an equivalent circuit. The reason is that at the present time, it is impossible to form the interconnection for directly connecting the buried contact 130b to the metal interconnection 140 due to limitations in the manufacturing process.

SUMMARY OF THE INVENTION

Embodiments of the present invention provide a semiconductor memory device capable of reducing the resistance of a connection line for connecting decoupling capacitors in series and implementing a single stage cell type decoupling capacitor as well as a two stage cell type decoupling capacitor.

According to one embodiment of the present invention, there is provided a semiconductor memory device including a cell array region having a contact layer that is in direct contact with the source/drain regions of a semiconductor substrate and a plurality of cell capacitors that are electrically connected to the contact layer, and further including a peripheral circuit region where at least one power decoupling capacitor is formed on the semiconductor substrate, wherein the power decoupling capacitor includes a plurality of capacitor arrays, each capacitor array including a plurality of capacitors. A plurality of first conductive layers are formed at the same level over the semiconductor substrate, wherein the plurality of first conductive layers include a bottom electrode of the cell capacitor and a bottom electrode of the power decoupling capacitor. A second conductive layer connects predetermined capacitor arrays among the plurality of capacitor arrays in parallel in the peripheral circuit region, wherein the second conductive layer includes a top electrode of the cell capacitor and a top electrode of the power decoupling capacitor. An interconnection layer is formed over the second conductive layer, wherein the interconnection layer is electrically connected to the second conductive layer. A third conductive layer is formed under the first conductive layer in the peripheral circuit region, for connecting predetermined capacitors among the plurality of capacitors in parallel, wherein the third conductive layer and the contact layer in the cell array region are made of the same material and are formed at the same level over the semiconductor substrate.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Embodiments of the invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present. In contrast, when an element is referred to as being "directly on" another element, there are no intervening elements present. As used herein, the term "and/or" includes any and all combinations of one or more of the associated listed items.

Figure 4:
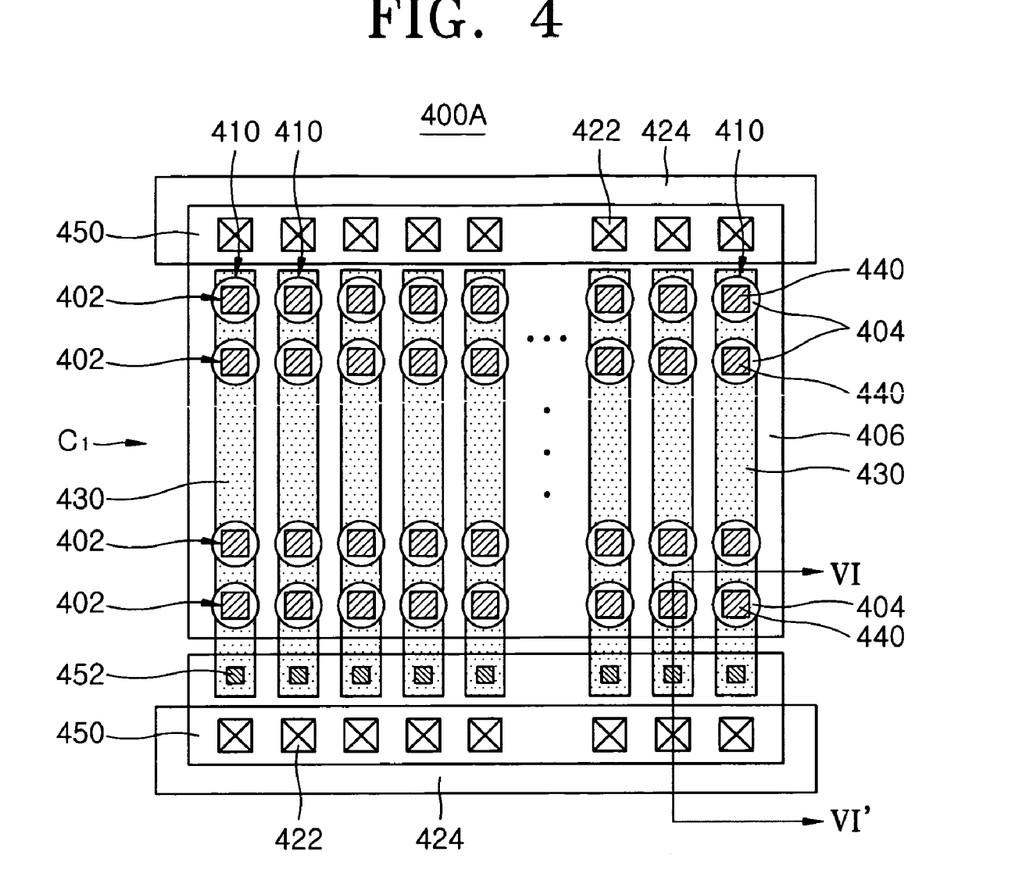
FIG. 4 is a schematic layout of a semiconductor memory device according to a first embodiment of the present invention.

FIG. 4 is a schematic layout of a semiconductor memory device according to a first embodiment of the present invention. In particular, FIG. 4 is a layout of a partial region in which a power decoupling capacitor C1 is formed in the shape of a single stage cell type in a peripheral circuit region of the semiconductor memory device 400A according to the first embodiment of the present invention.

Referring to FIG. 4, a power decoupling capacitor C1 configured with a plurality of capacitor arrays 410, each incorporating a plurality of capacitors 402, is formed in the peripheral circuit region of the semiconductor memory device 400A. Though FIG. 4 shows only one power decoupling capacitor for illustrative purpose, it is possible to form a plurality of power decoupling capacitors C1 having the same structure thereof.

Each of the plurality of capacitors 402 is provided with a bottom electrode 404 and a top electrode 406. The top electrode 406 is formed for connecting predetermined capacitor arrays among the plurality of capacitor arrays 410 to each other in parallel. The top electrode 406 is electrically connected to an upper-lying top interconnection layer 424 through an interconnection contact 422. Under the bottom electrode 404, a bottom conductive layer 430 is formed for connecting predetermined capacitors 402 selected among the plurality of capacitors 402 in parallel. The bottom conductive layer 430 is in direct contact with a top surface of the semiconductor substrate. Between the bottom electrode 404 and the bottom conductive layer 430, a buried contact layer 440 is formed so as to be electrically connected to the bottom electrode 404 and the bottom conductive layer 430.

In FIG. 4, the bottom conductive layer 430 is made in a bar type for connecting the plurality of capacitors 402 which are aligned in one capacitor array 410. The buried contact layer 440 is configured with a plurality of contact plugs formed between the bottom electrode 404 and the bottom conductive layer 430 so that they are arranged in the shape of a plurality of dots dispersed in the peripheral circuit region. However, the arrangement of the bottom conductive layer 430 and the buried contact 440 is not restricted to the above embodiment illustrated in FIG. 4; rather it is possible to modify various configurations within the scope of the present invention for electrically connecting the bottom conductive layer 430 to the top interconnection layer 424. More detailed descriptions for some of these various configurations will be set forth later with reference to other embodiments.

The bottom conductive layer 430 which connects the plurality of capacitors in parallel is electrically connected to the top interconnection layer 424. The bottom conductive layer 430 is connected to a bit line conductive layer 450 through a direct contact 452 and is connected to the top interconnection layer 424 through the interconnection contact 422. Again, the present invention is not limited to the above configuration; rather it is possible to use various methods in connecting the bottom conductive layer 430 to the top interconnection layer 424, which is obvious to those skilled in the art.

Figure 5:
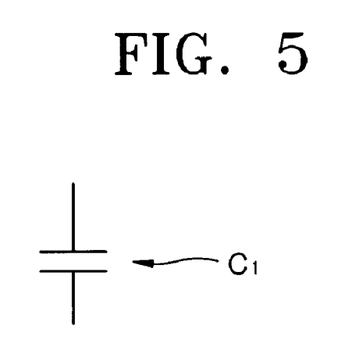
FIG. 5 is an equivalent circuit diagram of a power decoupling capacitor illustrated in FIG. 4.

FIG. 5 is an equivalent circuit diagram of the power decoupling capacitor C1 illustrated in FIG. 4.

Figure 6:
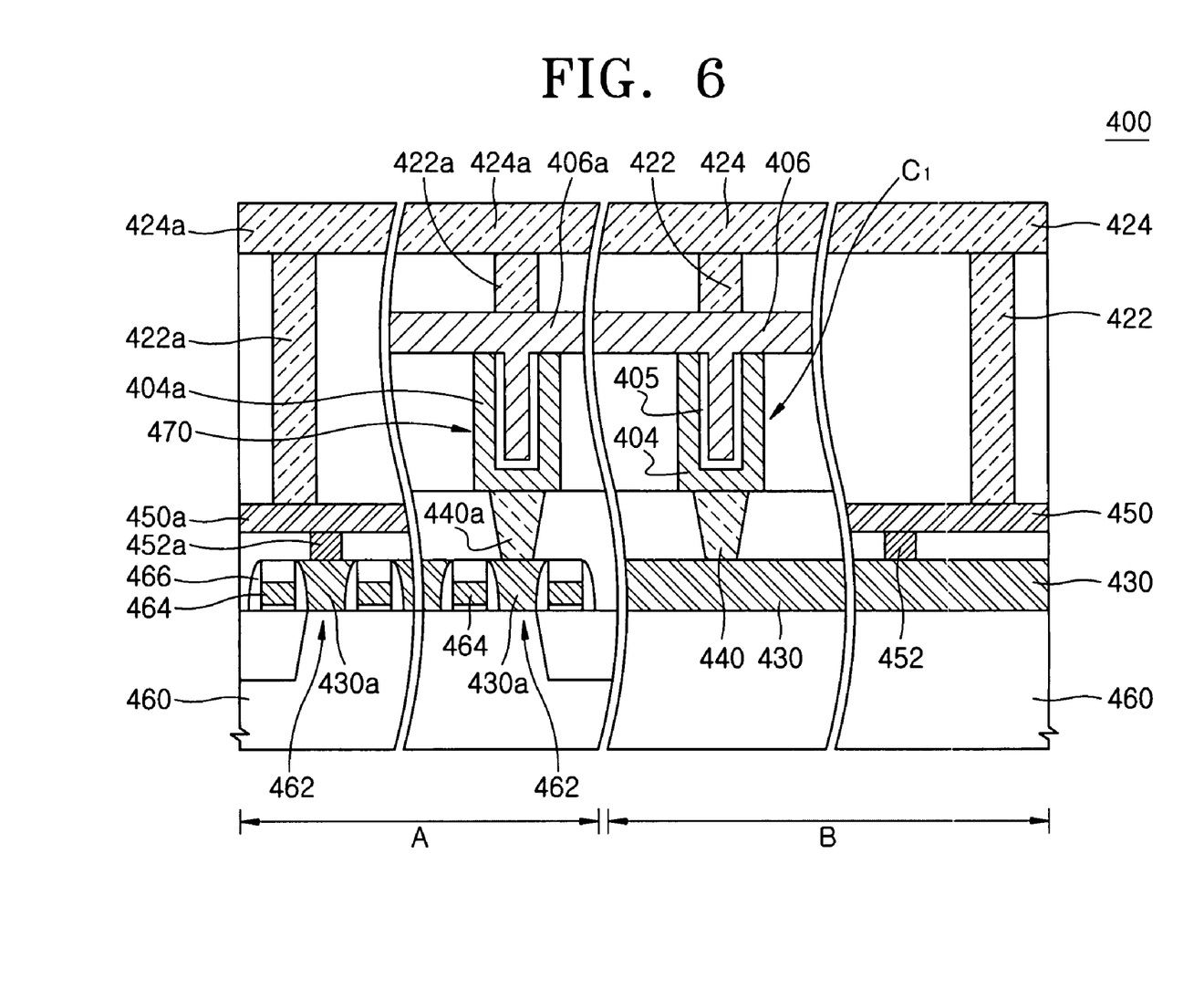
FIG. 6 is a cross sectional view taken along line VI-VI' of FIG. 4 according to the first embodiment of the present invention.

FIG. 6 is a cross sectional view of the semiconductor memory device taken along the line VI-VI' of FIG. 4 according to the first embodiment of the present invention. It is noted that elements of the cell array region A as well as elements of the peripheral circuit region B are formed at the same level over the semiconductor substrate.

Referring to FIG. 6, the semiconductor memory device 400 according to the first embodiment of the present invention includes a self-align contact layer 430a and a plurality of cell capacitors 470, wherein the self-align contact layer 430a is directly connected to source/drain regions 462 of a semiconductor substrate 460 and the plurality of cell capacitors 470 are electrically connected to the self-align contact layer 430a through a buried contact layer 440a. The self-align contact layer 430a is self-aligned between neighboring gates provided with a gate electrode 464 and insulating spacers 466 formed on sidewalls thereof.

The bottom conductive layer 430 in the peripheral circuit region B is formed at the same level with the self-align contact layer 430a in the cell array region over the semiconductor substrate 460. The self-align contact layer 430a and the bottom conductive layer 430 are formed at the same time so that they may be made of the same material.

In the peripheral circuit region B, a dielectric layer 405 is interposed between the bottom electrode 404 and the top electrode 406, which results in forming the power decoupling capacitor C1. The bottom electrode 404 of the power decoupling capacitor C1 and the bottom electrode 404a of the cell capacitor 470 in the cell array region A are formed simultaneously so that the bottom electrodes 404 and 404a are formed at the same level over the substrate 460 and may be made of the same material. Likewise, the top electrode 406 of the power decoupling capacitor C1 and the top electrode 406a of the cell capacitor 470 in the cell array region A are formed at the same time so that the top electrodes 406 and 406a are formed at the same level over the substrate 460 and may be made of the same material.

Furthermore, the buried contact layer 440 in the peripheral circuit region B, which is electrically connected to both the bottom electrode 404 and the bottom conductive layer 430, and the buried contact layer 440a in the cell array region A are formed at the same level over the semiconductor substrate 460 and may be made of the same material.

Likewise, the interconnection contact 422, the top interconnection layer 424, the bit line conductive layer 450, and the direct contact 452 in the peripheral circuit region B and the interconnection contact 422a, the top interconnection layer 424a, the bit line conductive layer 450a, and the direct contact 452a in the cell array region A are formed at the same levels over the semiconductor substrate 460, whereby each element in the peripheral circuit region B corresponding to the element in the cell array region A may be made of the same material. While it is not shown in FIG. 4, the top electrode 406 of the power decoupling capacitor C1 is electrically connected to the top interconnection layer 424 through the interconnection contact 422.

Figure 7:
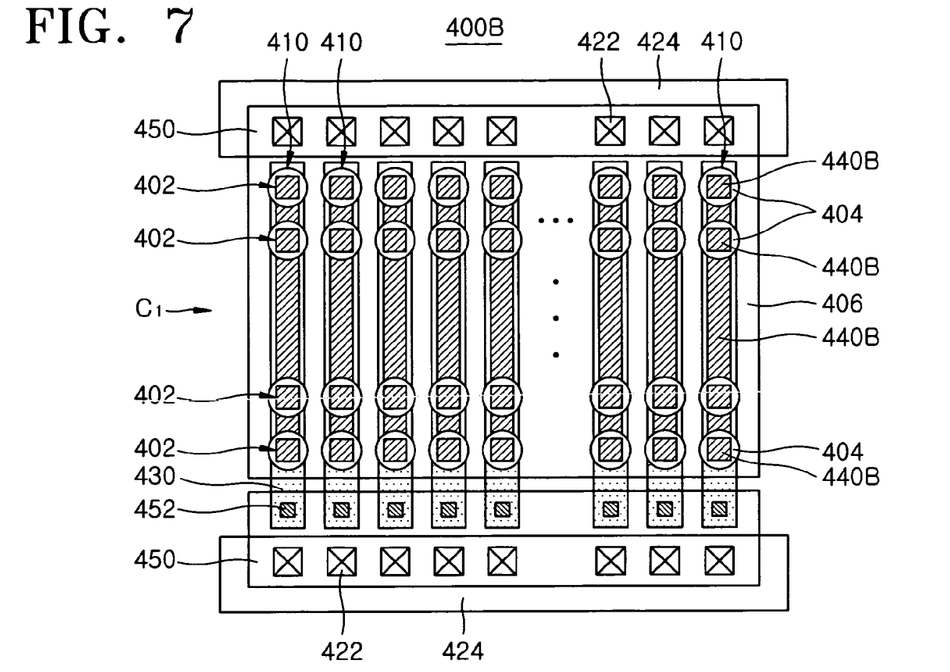
FIG. 7 is a schematic layout of a semiconductor memory device according to a second embodiment of the present invention.

FIG. 7 is a schematic layout of a semiconductor memory device according to a second embodiment of the present invention.

Referring to FIG. 7, the constitution of the semiconductor memory device 400B of the second embodiment is same with that of the semiconductor memory device 400A illustrated in FIG. 4 except that the buried contact layer 440B is extended in the shape of a bar type. In particular, in the semiconductor memory device 400B, the buried contact layer 440B is provided with a plurality of bar patterns which are extended in parallel to the bottom conductive layer 430. Since the other elements of device 400B are similar to those of device 400A, further detailed descriptions will be abbreviated herein.

Figure 8:
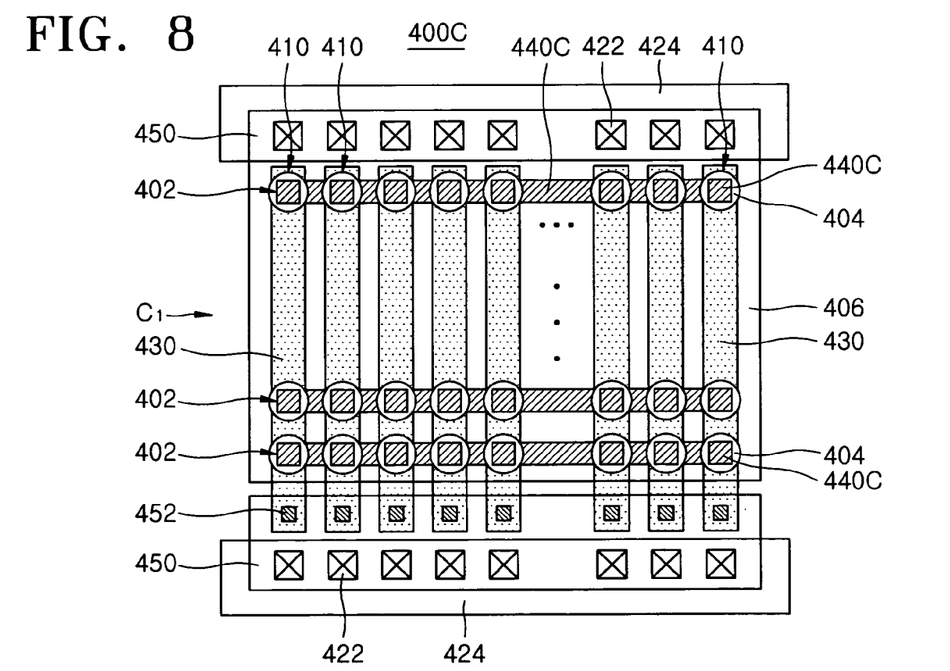
FIG. 8 is a schematic layout of a semiconductor memory device according to a third embodiment of the present invention.

FIG. 8 is a schematic layout of a semiconductor memory device according to a third embodiment of the present invention.

In the third embodiment, the buried contact layer 440C is arranged in the shape of a bar type, and is extended to connect the plurality of capacitors 402 in parallel like the semiconductor memory device 440B of shown in FIG. 7. Noticeably, the buried contact layer 440C of the third embodiment is provided with a plurality of bar patterns which are extended perpendicular to the bottom conductive layer 430. Since the other elements of the semiconductor memory device 400C are same as those of the first embodiment shown in FIG. 4, further descriptions will be abbreviated herein.

Figure 9:
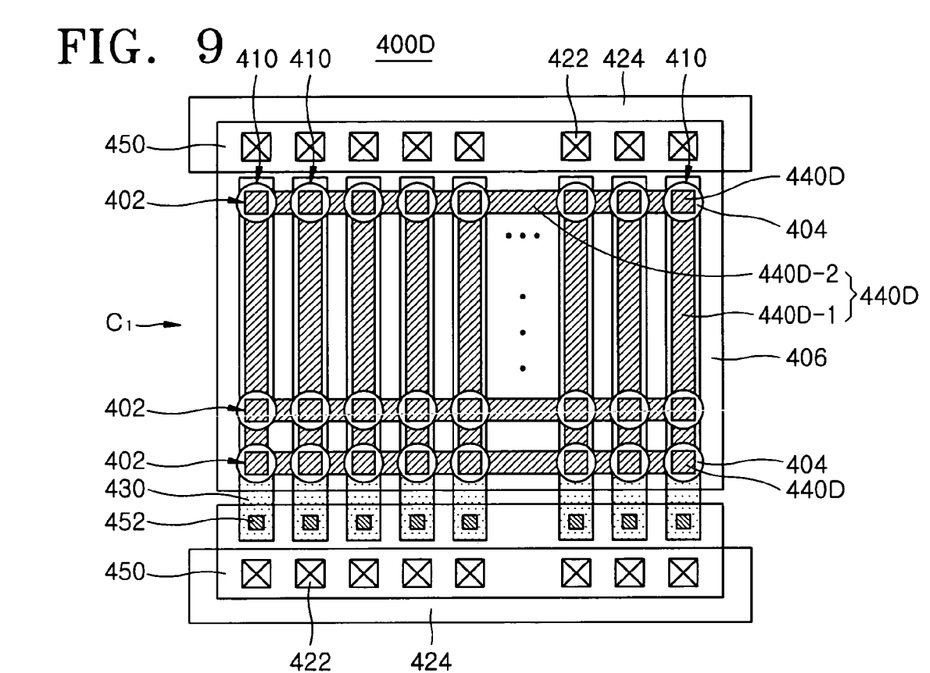
FIG. 9 is a schematic layout of a semiconductor memory device according to a fourth embodiment of the present invention.

FIG. 9 is a schematic layout of a semiconductor memory device according to a fourth embodiment of the present invention.

In the semiconductor memory device 400D of the fourth embodiment, the buried contact layer 440D is provided with a plurality of first bar patterns 440D-1 and a plurality of second bar patterns 440D-2, wherein the plurality of the first bar patterns 440D-1 are extended in parallel to the bottom conductive layer 430 in order to connect the plurality of capacitors 402 in parallel, and the plurality of second bar patterns 440D-2 are arranged perpendicular to the bottom conductive layer 430 in order to further connect the plurality of capacitors 402 in parallel. That is, the plurality of the first bar patterns 440D-1 and the plurality of the second bar patterns 440D-2 are cross-linked so as to be a mesh type pattern. Since the other elements of the semiconductor memory device 400D are same to those of the first embodiment shown in FIG. 4, further descriptions will be abbreviated herein.

Figure 10:
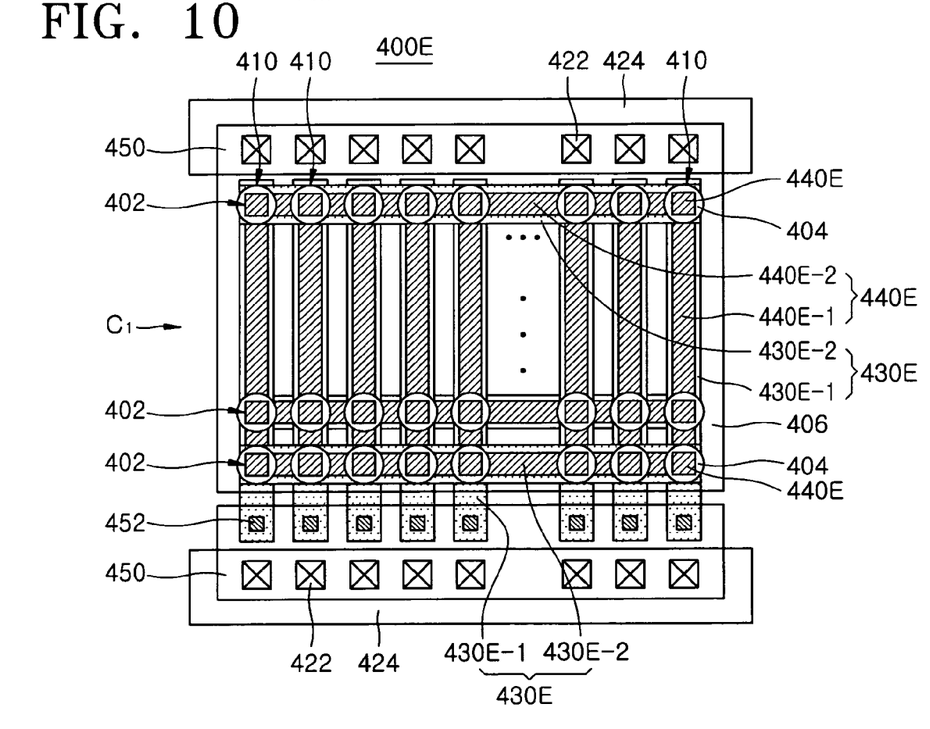
FIG. 10 is a schematic layout of a semiconductor memory device according to a fifth embodiment of the present invention.

FIG. 10 is a schematic layout of a semiconductor memory device according to a fifth embodiment of the present invention.

In the fifth embodiment, the buried contact layer 440E is again formed in a mesh type pattern so that a plurality of the first bar patterns 440E-1 and a plurality of second bar patterns 440E-2 are cross-linked. In addition, the bottom conductive layer 430E is provided with a plurality of first bar patterns 430E-1 and a plurality of second bar patterns 430E-2, wherein the plurality of first bar patterns 430E-1 are parallel with the first bar patterns 440E-1 of the buried contact layer 440E, and the plurality of second bar patterns 430E-2 are parallel with the second bar patterns 440E-2 of the buried contact layer 440E. Like the buried contact layer 440E, the plurality of the first bar patterns 430E-1 and the plurality of the second bar patterns 430E-2 are cross-linked so as to be in a mesh type pattern. Since the other elements of the semiconductor memory device 400E are same to those of the first embodiment shown in FIG. 4, further descriptions will be abbreviated herein.

Figure 11:
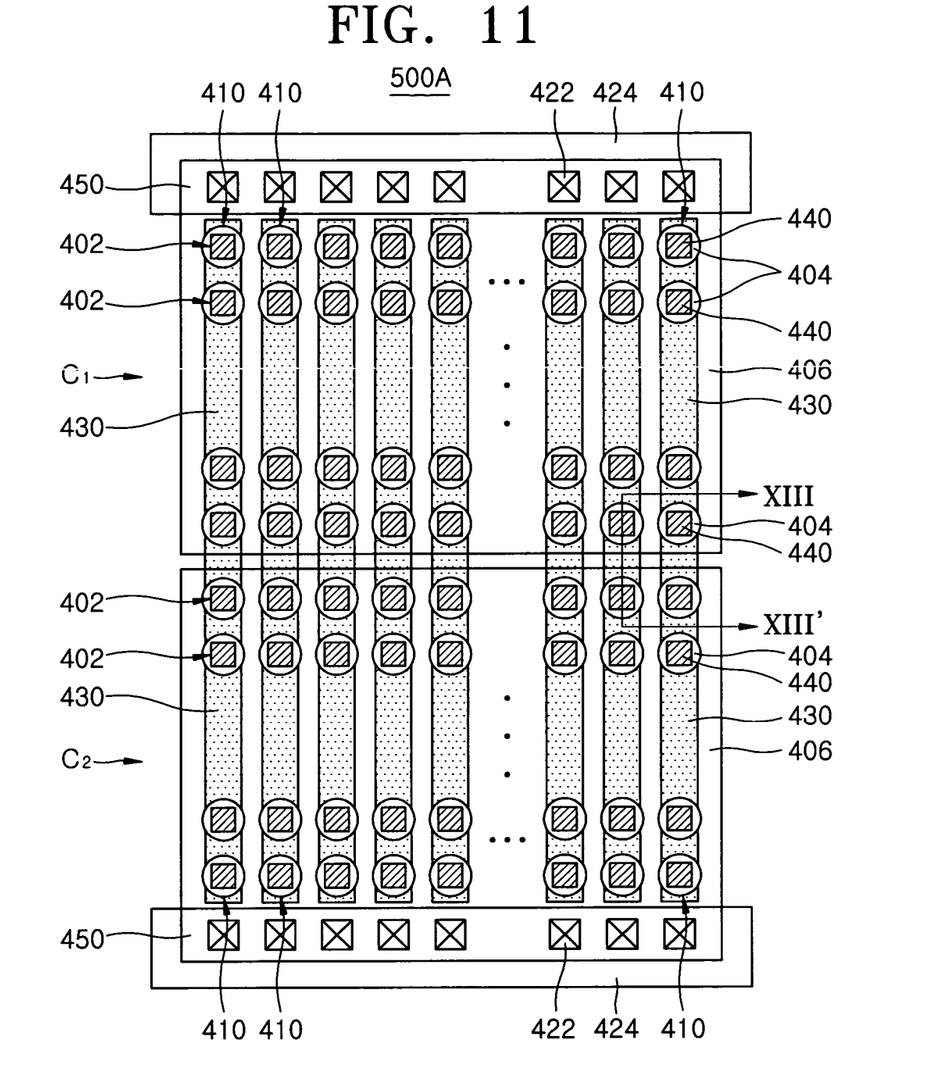
FIG. 11 is a schematic layout of a semiconductor memory device according to a sixth embodiment of the present invention.

FIG. 11 is a schematic layout of a semiconductor memory device according to a sixth embodiment of the present invention. In particular, FIG. 11 is a layout of a partial region in which two capacitors C1 and C2 are formed in a shape of two-stage cell type in a peripheral circuit region of the semiconductor memory device 500A according to the sixth embodiment of the present invention.

Referring to FIG. 11, elements and constitution of each capacitor C1 and C2 in the sixth embodiment are similar to the power decoupling capacitor of the first embodiment shown in FIG. 4 except that two capacitors C1 and C2 are connected to each other in series by means of the bottom conductive layer 430.

Figure 12:
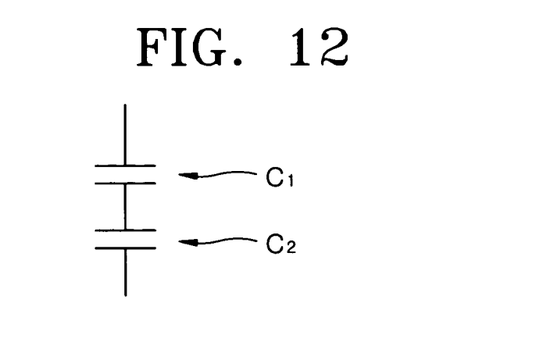
FIG. 12 is an equivalent circuit diagram of a power decoupling capacitor illustrated in FIG. 11.

FIG. 12 is an equivalent circuit diagram of a power decoupling capacitor illustrated in FIG. 11. In particular, the power decoupling capacitor can be represented by the two capacitors C1 and C2 connected in series.

Figure 13:
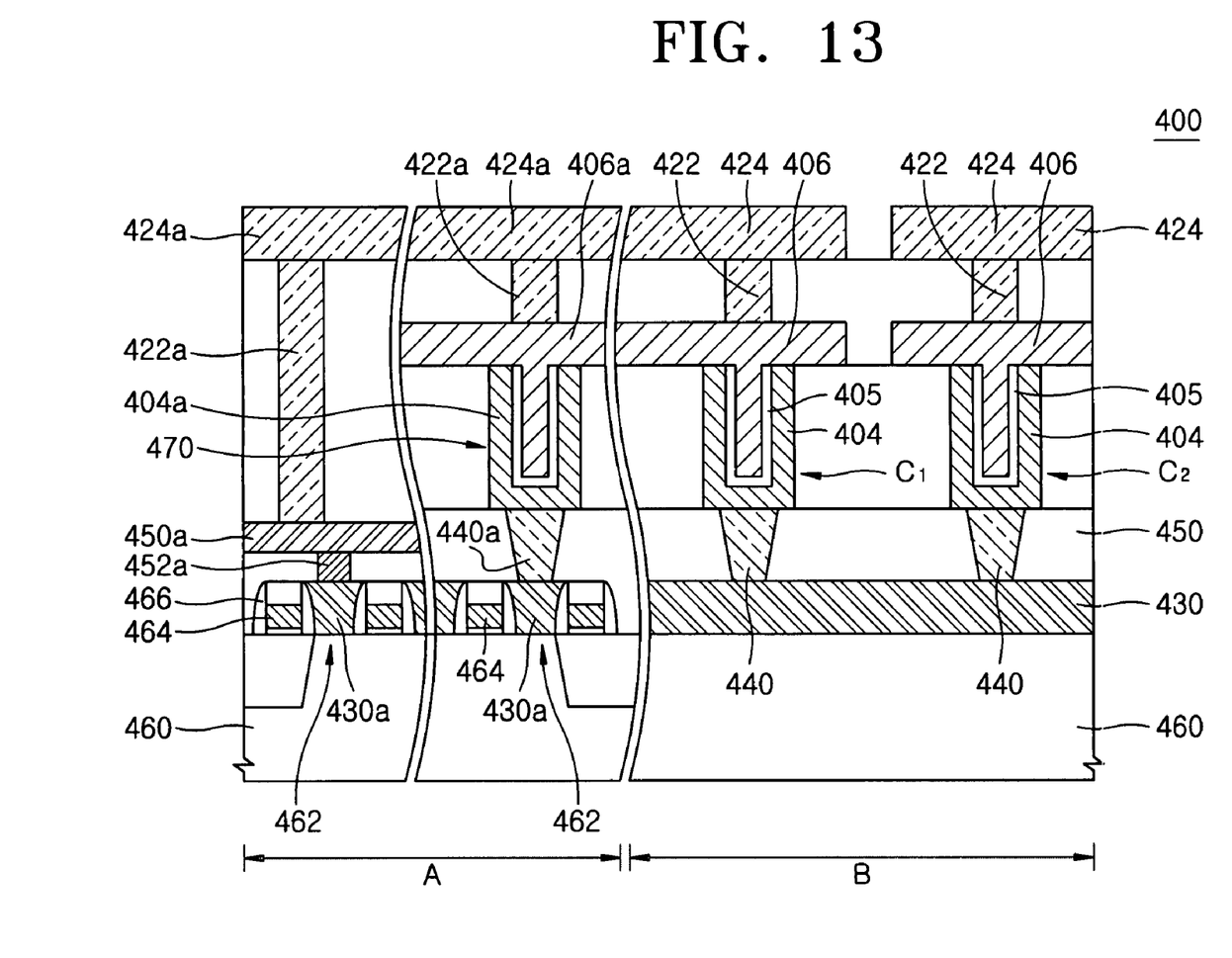
FIG. 13 is a sectional view taken along line XIII-XIII' of FIG. 11 according to the sixth embodiment of the present invention.

FIG. 13 is a cross sectional view of the semiconductor memory device taken along the line XIII-XIII' of FIG. 11 according to the sixth embodiment of the present invention. It is noted that elements of the cell array region A as well as elements of the peripheral circuit region B are formed at a same level on the semiconductor substrate.

Referring to FIG. 13, two capacitors are connected to each other in series by means of the bottom conductive layer 430. The bottom conductive layer 430 in the peripheral circuit region B and the self-align contact layer 430a in the cell array region A are formed at the same level over the substrate 460. Furthermore, the bottom conductive layer 430 and the self-align contact layer 430a are formed simultaneously so that they may be made of the same material. Moreover, each of top electrodes 406 of the capacitors C1 and C2 is electrically connected to a top interconnection layer 424 through an interconnection contact 422. Since the other elements described in FIG. 13 are similar to those of FIG. 6, further descriptions will be abbreviated herein.

Figure 14:
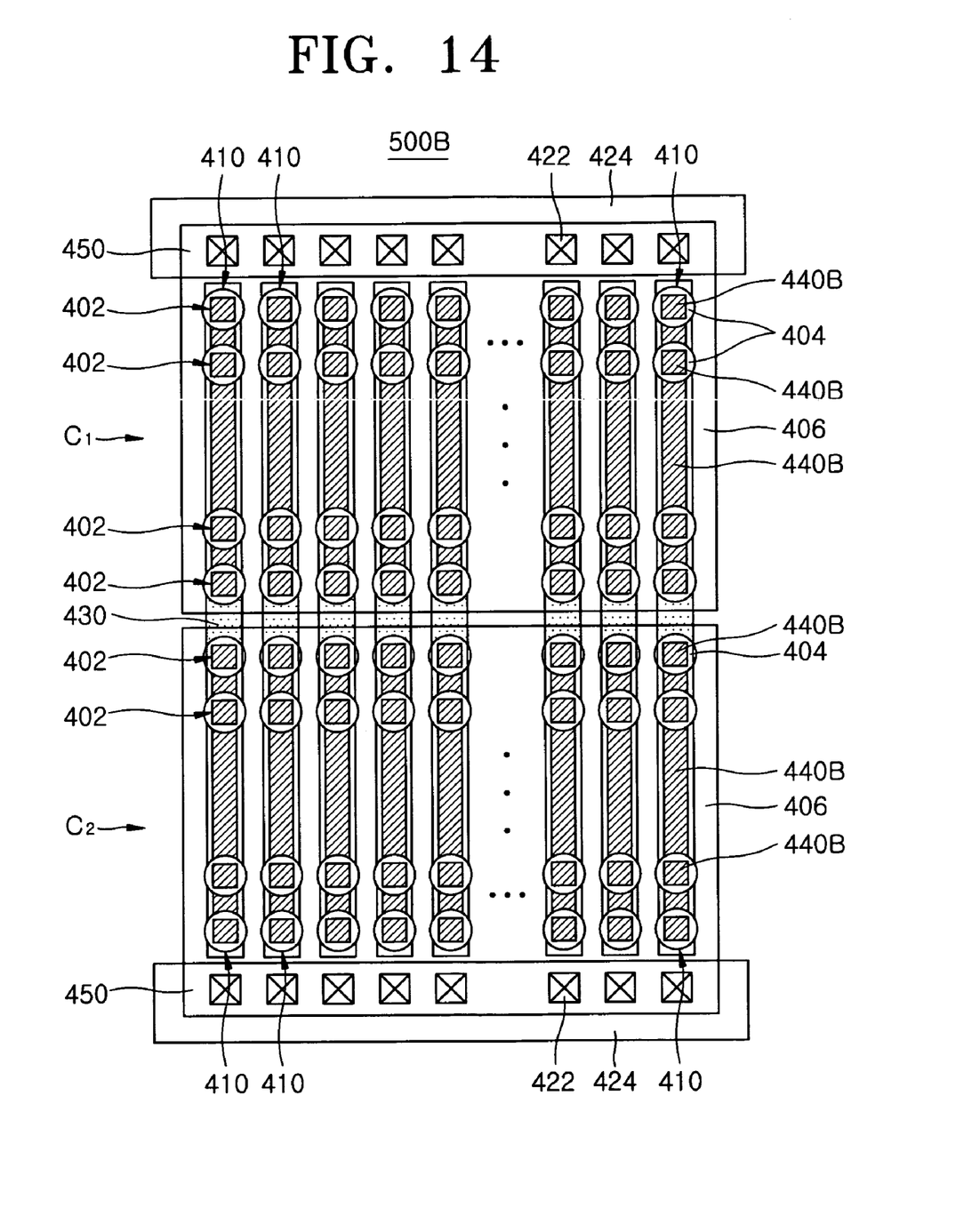
FIG. 14 is a schematic layout of a semiconductor memory device according to a seventh embodiment of the present invention.

FIG. 14 is a schematic layout of a semiconductor memory device according to a seventh embodiment of the present invention.

Referring to FIG. 14, a semiconductor memory device 500B includes two capacitors C1 and C2, which are connected to each other in series. Since the architecture details of the capacitors C1 and C2 are similar to the decoupling capacitor described in FIG. 7, further descriptions will be abbreviated herein.

Figure 15:
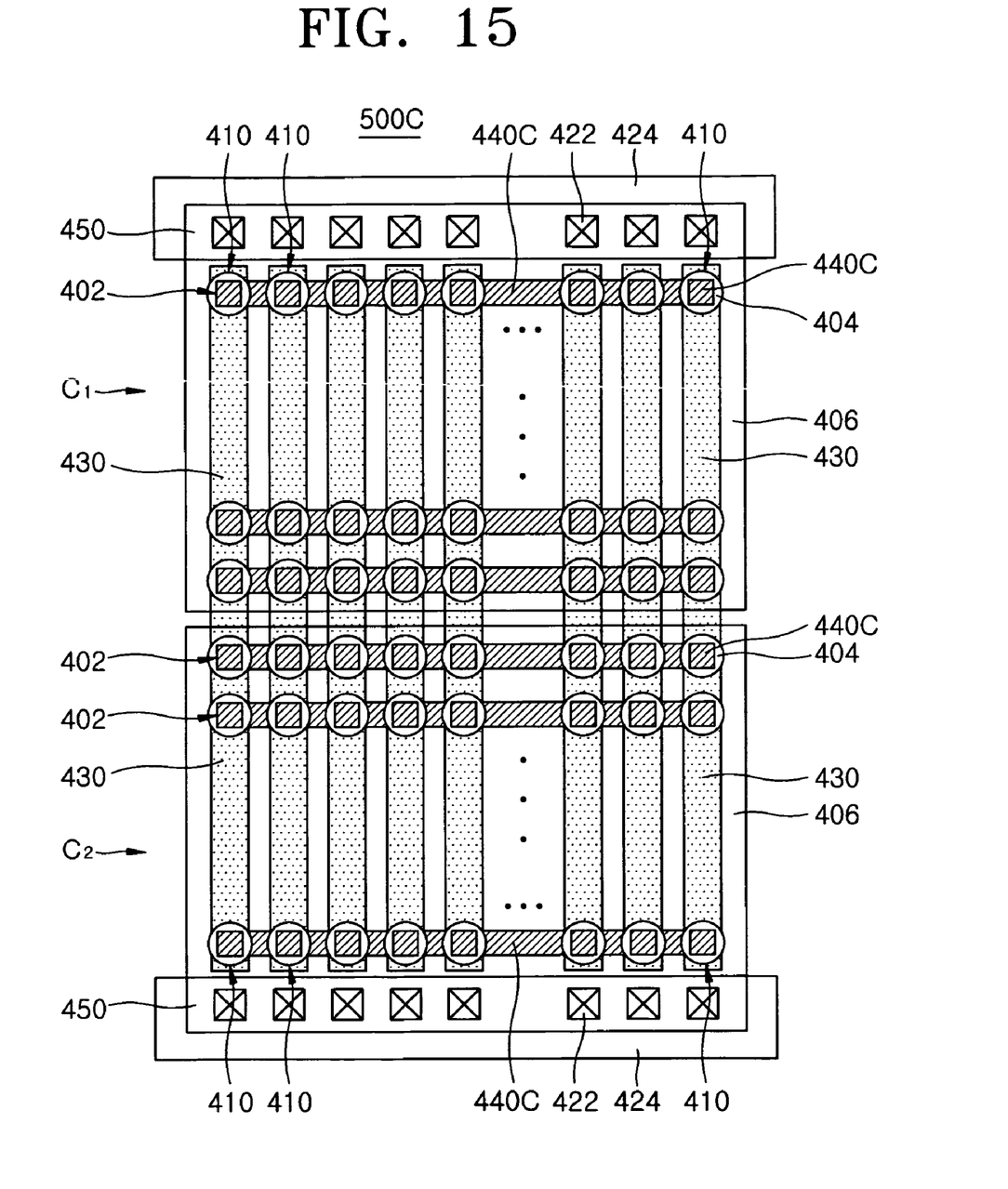
FIG. 15 is a schematic layout of a semiconductor memory device according to an eighth embodiment of the present invention.

FIG. 15 is a schematic layout of a semiconductor memory device according to a eighth embodiment of the present invention.

Referring to FIG. 15, a semiconductor memory device 500C includes two capacitors C1 and C2, which are connected to each other in series by means of a bottom conductive layer 430. Since the architecture details of the capacitors C1 and C2 are similar to the decoupling capacitor described in FIG. 8, further descriptions will be abbreviated herein.

Figure 16:
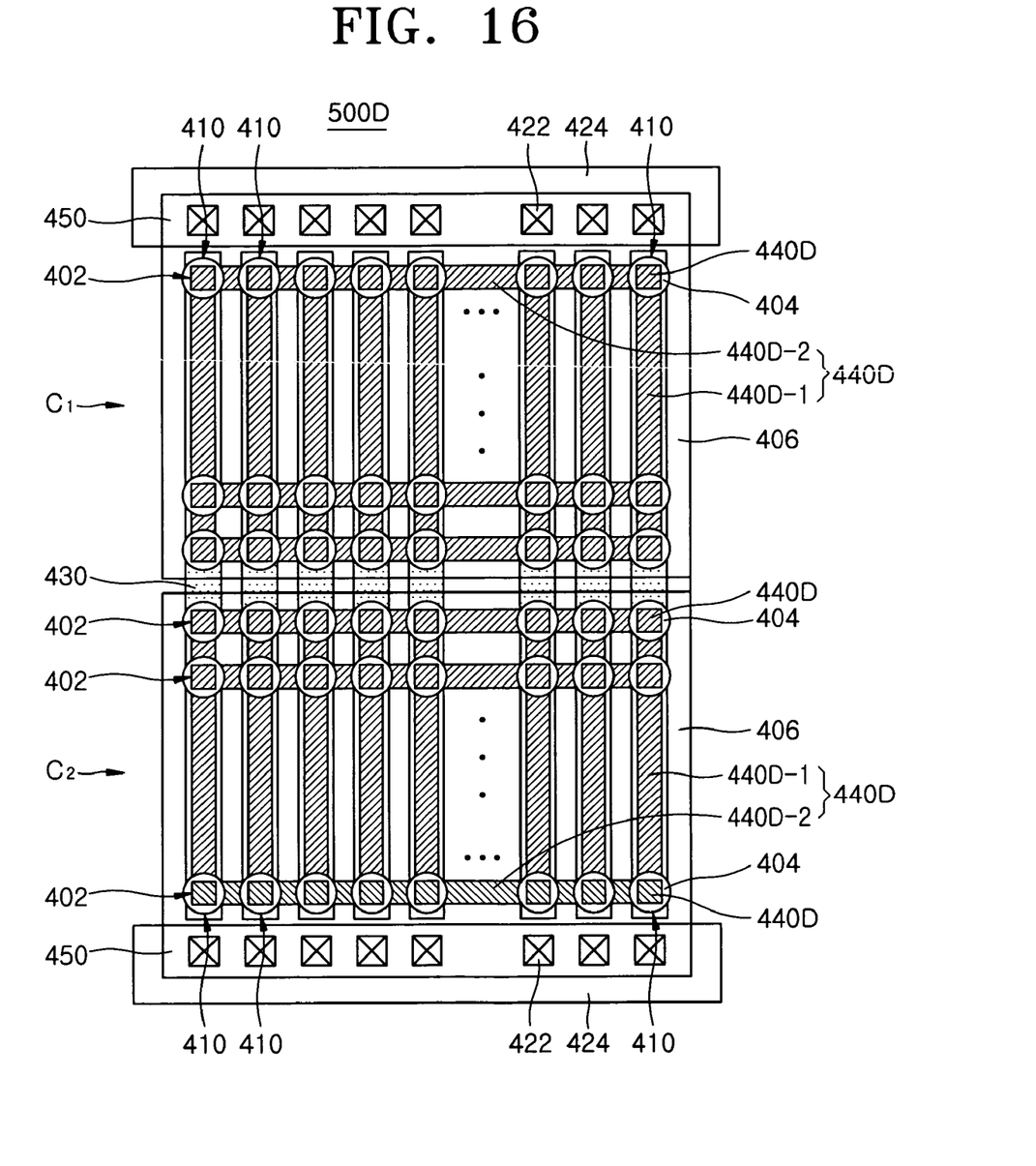
FIG. 16 is a schematic layout of a semiconductor memory device according to a ninth embodiment of the present invention.

FIG. 16 is a schematic layout of a semiconductor memory device according to a ninth embodiment of the present invention.

Referring to FIG. 16, a semiconductor memory device 500D includes two capacitors C1 and C2, which are connected to each other in series by means of a bottom conductive layer 430. Since the architecture details of the capacitors C1 and C2 are similar to the decoupling capacitor described in FIG. 9, further descriptions will be abbreviated herein.

Figure 17:
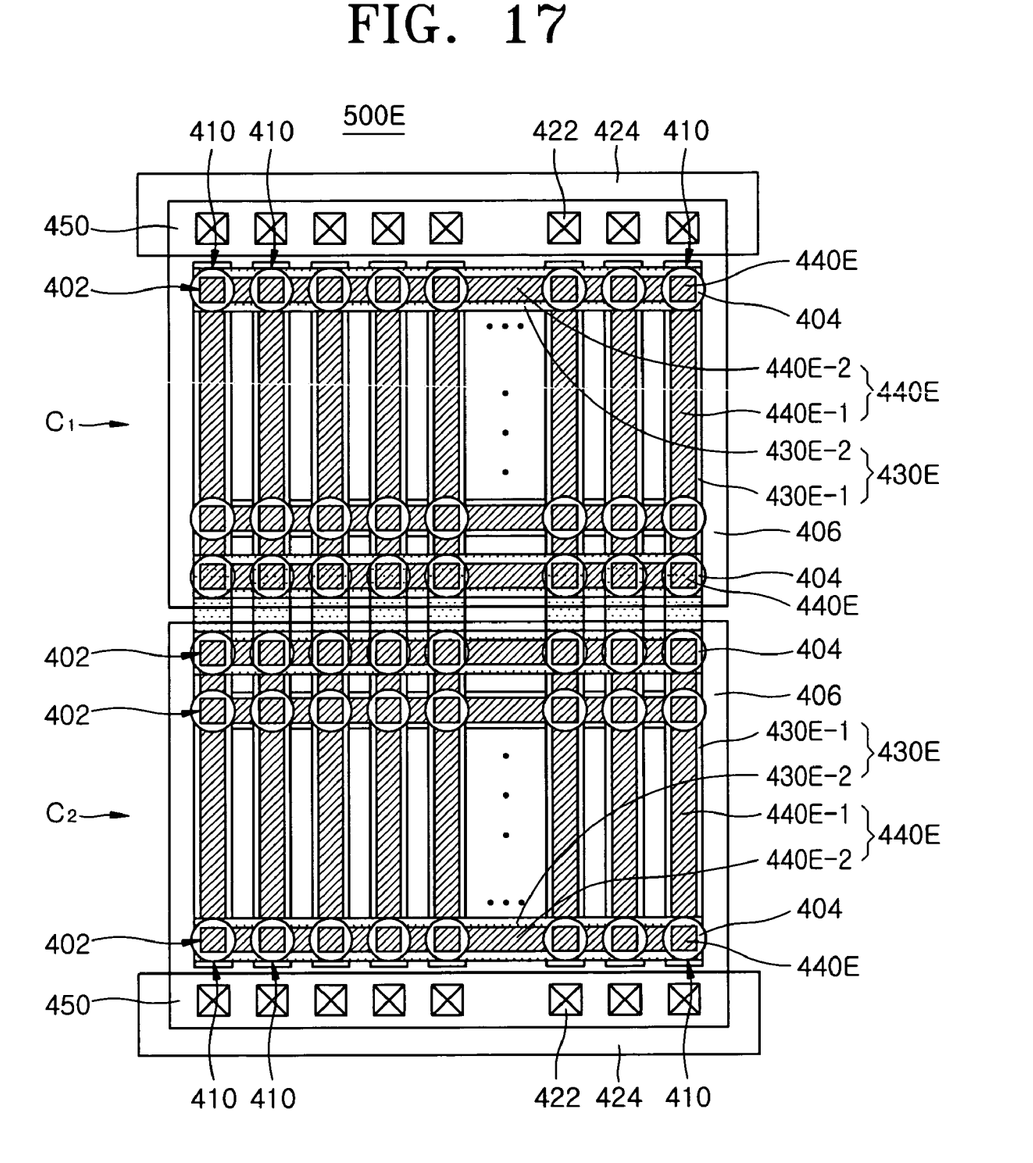
FIG. 17 is a schematic layout of a semiconductor memory device according to a tenth embodiment of the present invention.

FIG. 17 is a schematic layout of a semiconductor memory device according to a tenth embodiment of the present invention.

Referring to FIG. 17, a semiconductor memory device 500E includes two capacitors C1 and C2, which are connected to each other in series by means of a bottom conductive layer 430. Since the architecture details of the capacitors C1 and C2 are similar to the decoupling capacitor described in FIG. 10, further descriptions will be abbreviated herein.

According to the present invention, a semiconductor memory device includes a power decoupling capacitor configured with a plurality of capacitors formed in a peripheral circuit region. Meanwhile, the bottom conductive layer, which connects the plurality of capacitors in parallel, is simultaneously formed with the self-align contact in the cell array region. In embodiments where the power decoupling capacitor is provided with the plurality of capacitors in series, the capacitors are connected to each other in series through the bottom conductive layer.

Further embodiments of the semiconductor memory device specify that the bottom conductive layer in the peripheral circuit region, which is simultaneously formed with the self-align contact in the cell array region, is connected to one electrode of the power decoupling capacitor, thus eliminating the need for a connection layer such as a buffer layer between contacts disposed between the bottom electrode of the cell capacitor and the cell transistor, i.e., between the buried contact and the self-align contact. Therefore, it is possible to easily form the bottom conductive layer in the peripheral circuit region to be electrically connected to the top interconnection layer by using the manufacturing steps of forming an interconnection contact such as a direct contact, bit line, and a metal contact required for the cell array region. Accordingly, it is also possible to embody the single stage cell type power decoupling capacitor in the semiconductor memory device.

Additionally, in comparison with the prior art, it is possible to reduce the phenomenon of decreased capacitance effectively, which is a serious problem in the prior art, by making use of the bottom conductive layer as the interconnection line in the embodiment including the formation of a two stage cell type decoupling capacitor, wherein the bottom conductive layer is simultaneously formed with the self-align contact. Furthermore, the capacitance of the capacitor can be maximized by selecting a layout scheme of the bottom conductive layer or the buried contact existing between the bottom conductive layer and the bottom electrode of the capacitor.

Moreover, the decoupling capacitor of the inventive semiconductor memory device may be embodied as the single stage cell type capacitor so that it may be easily applied to instances where the voltage difference from the ground voltage is not too high, i.e., core bulk bias level ($V_{BB}$) or negative wordline voltage level ($V_{BB2}$).

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor memory device comprising:
   a cell array region including a contact layer that directly contacts with source/drain regions of a semiconductor substrate and a plurality of cell capacitors that are electrically connected to the contact layer;

a peripheral circuit region in which at least one power decoupling capacitor is formed on the semiconductor substrate, wherein the power decoupling capacitor includes a plurality of capacitor arrays, each of the capacitor arrays including a plurality of capacitors;

a plurality of first conductive layers formed at the same level over the semiconductor substrate, wherein the plurality of first conductive layers include a bottom electrode of the cell capacitor and a bottom electrode of the power decoupling capacitor;

a second conductive layer for connecting predetermined capacitor arrays among the plurality of capacitor arrays in parallel in the peripheral circuit region, wherein the second conductive layer includes a top electrode of the cell capacitor and a top electrode of the power decoupling capacitor;

an interconnection layer formed over the second conductive layer, wherein the interconnection layer is electrically connected to the second conductive layer; and a third conductive layer formed under the first conductive layer in the peripheral circuit region, for connecting predetermined capacitors among the plurality of capacitors in parallel, wherein the third conductive layer and the contact layer in the cell array region are made of the same material and are formed at the same level over the semiconductor substrate.

2. The semiconductor memory device of claim 1, wherein the third conductive layer connects the interconnection layer to a first electrode of each capacitor connected in parallel.

3. The semiconductor memory device of claim 1, wherein the peripheral circuit region includes a plurality of decoupling capacitors connected in series, the plurality of decoupling capacitors being connected to each other in series by means of the third conductive layer.

4. The semiconductor memory device of claim 1, further comprising a plurality of gate electrodes formed in the cell array region on the semiconductor substrate, wherein the contact layer is a self-align contact layer formed between two neighboring gate electrodes, the self-align contact layer being self-aligned by said neighboring gate electrodes.

5. The semiconductor memory device of claim 4, further comprising:

a fourth conductive layer formed in the peripheral circuit region, wherein the fourth conductive layer is electrically connected to the first conductive layer and the third conductive layer; and a buried contact layer formed in the cell array region, wherein the buried contact layer is electrically connected to the self-align contact layer and the bottom electrode of the cell capacitors, wherein the fourth conductive layer and the buried contact layer are made of the same material and are formed at the same level over the semiconductor substrate.

6. The semiconductor memory device of claim 5, wherein the fourth conductive layer includes a plurality of contact plugs formed between the first conductive layer and the third conductive layer in the peripheral circuit region, the fourth conductive layer being arranged in a shape of a dot type in the peripheral circuit region.

7. The semiconductor memory device of claim 5, wherein the fourth conductive layer connects predetermined capacitors selected among the plurality of capacitors in parallel under the first conductive layer.

8. The semiconductor memory device of claim 7, wherein the fourth conductive layer is arranged in a bar type shape for connecting the plurality of capacitors in parallel, in which the plurality of capacitors are arranged in a row.

9. The semiconductor memory device of claim 8, wherein the fourth conductive layer is provided with a plurality of bar patterns which are extended in parallel in a first predetermined direction.

10. The semiconductor memory device of claim 8, wherein the fourth conductive layer is provided with a plurality of first bar patterns which are extended in parallel in a first predetermined direction and a plurality of second bar patterns which are extended in parallel in a second predetermined direction, the first direction being perpendicular to the second direction.

11. The semiconductor memory device of claim 10, wherein the fourth conductive layer is arranged in a mesh type shape where the first bar patterns and the second bar patterns are cross-linked.

12. The semiconductor memory device of claim 1, wherein the third conductive layer is arranged in a bar type shape for connecting the plurality of capacitors in parallel, in which the plurality of capacitors are arranged in a row.

13. The semiconductor memory device of claim 12, wherein the third conductive layer of the bar type shape is provided with a plurality of bar patterns which are extended in parallel in a first predetermined direction.

14. The semiconductor memory device of claim 12, wherein the third conductive layer is provided with a plurality of first bar patterns which are extended in parallel in a first predetermined direction and a plurality of second bar patterns which are extended in parallel in a second predetermined direction, the first direction being perpendicular to the second direction.

15. The semiconductor memory device of claim 14, wherein the third conductive layer is arranged in a mesh type shape where the first bar patterns and the second bar patterns are cross-linked.

16. The semiconductor memory device of claim 5, wherein each of the third conductive layer and the fourth conductive layer is arranged in a bar type shape for connecting the plurality of capacitors in parallel, in which the plurality of capacitors are arranged in a row.

17. The semiconductor memory device of claim 16, wherein the third and the fourth conductive layers are extended in parallel to each other.

18. The semiconductor memory device of claim 16, wherein the third and the fourth conductive layers are extended perpendicular to each other.

19. The semiconductor memory device of claim 5, wherein the third conductive layer is arranged in a bar type shape for connecting the plurality of capacitors in parallel and the fourth conductive layer is arranged in a dot type shape and is provided with a plurality of contact plugs formed between the first conductive layer and the third conductive layer in the peripheral circuit region, in which the plurality of capacitors are arranged in a row.

20. The semiconductor memory device of claim 5, wherein the third conductive layer and the fourth conductive layer are arranged in a mesh type shape and are provided with a plurality of first bar patterns which are extended in parallel in a first predetermined direction and a plurality of second bar patterns which are extended in parallel in a second predetermined direction, the first direction being perpendicular to the second direction.

* * * * *